US012224152B2

(12) United States Patent
Kruit

(10) Patent No.: US 12,224,152 B2
(45) Date of Patent: Feb. 11, 2025

(54) MULTI-BEAM CHARGED PARTICLE SOURCE WITH ALIGNMENT MEANS

(71) Applicants: Technische Universiteit Delft, Delft (NL); Applied Materials Israel, Ltd., Rehovot (IL)

(72) Inventor: Pieter Kruit, Delft (NL)

(73) Assignees: TECHNISCHE UNIVERSITEIT DELFT (NL); APPLIED MATERIALS ISRAEL, LTD. (IL)

(*) Notice: Subject to any disclaimer, the term of this patent is extended or adjusted under 35 U.S.C. 154(b) by 0 days.

(21) Appl. No.: 17/768,802

(22) PCT Filed: Oct. 20, 2020

(86) PCT No.: PCT/NL2020/050645
§ 371 (c)(1),
(2) Date: Apr. 13, 2022

(87) PCT Pub. No.: WO2021/080420
PCT Pub. Date: Apr. 29, 2021

(65) Prior Publication Data
US 2024/0096585 A1 Mar. 21, 2024

(30) Foreign Application Priority Data
Oct. 21, 2019 (NL) .................................... 2024065

(51) Int. Cl.
*H01J 37/14* (2006.01)
*H01J 37/10* (2006.01)
*H01J 37/147* (2006.01)
(52) U.S. Cl.
CPC ............ *H01J 37/147* (2013.01); *H01J 37/10* (2013.01)
(58) Field of Classification Search
CPC .................................. H01J 37/147; H01J 37/10
See application file for complete search history.

(56) References Cited

U.S. PATENT DOCUMENTS 4,393,308 A * 7/1983 Anger ..................... H01J 37/06
313/361.1
8,183,543 B2 5/2012 Platzgummer ............. 250/492.2
(Continued)

FOREIGN PATENT DOCUMENTS

CN 110214361 9/2019 ............ H01J 37/28
EP 1 766 653 8/2009 ............ H01J 37/317
(Continued)

OTHER PUBLICATIONS

International Preliminary Report on Patentability issued in PCT/NL2020/050645, dated Apr. 26, 2022, 10 pages.
(Continued)

*Primary Examiner* — Nicole M Ippolito
(74) *Attorney, Agent, or Firm* — HAYES SOLOWAY P.C.

(57) ABSTRACT

Disclosed are an apparatus and method for generating a plurality of substantially collimated charged particle beamlets. The apparatus includes a charged particle source for generating a diverging charged particle beam, a beam splitter for splitting the charged particle beam in an array of charged particle beamlets, a deflector array includes an array of deflectors including one deflector for each charged particle beamlet of said array of charged particle beamlets, wherein the deflector array is configured for substantially collimating the array of diverging charged particle beamlets. The apparatus further includes a beam manipulation device configured for generating electric and/or magnetic fields at least in an area between the charged particle source and the deflector array. The apparatus has a central axis, and the beam manipulation device is configured for generating electric and/or magnetic fields substantially parallel to the central axis and substantially perpendicular to the central axis.

26 Claims, 11 Drawing Sheets

(56) References Cited

U.S. PATENT DOCUMENTS

| | | | | |
|---|---|---|---|---|
| 9,202,666 | B1* | 12/2015 | Frosien | H01L 37/147 |
| 9,666,406 | B1* | 5/2017 | Lanio | H01J 37/1475 |
| 2004/0232349 | A1 | 11/2004 | Kruit | 250/396 R |
| 2005/0006598 | A1* | 1/2005 | Pearl | H01J 37/1471 |
| | | | | 250/397 |
| 2010/0224789 | A1 | 9/2010 | Sakai et al. | 250/397 |
| 2011/0220795 | A1 | 9/2011 | Frosien | 250/307 |
| 2012/0168638 | A1* | 7/2012 | Parker | H01J 37/1471 |
| | | | | 250/396 R |
| 2013/0320846 | A1* | 12/2013 | Yamada | H01J 29/64 |
| | | | | 315/5.35 |
| 2014/0014852 | A1* | 1/2014 | Wieland | B82Y 10/00 |
| | | | | 250/396 R |
| 2017/0178862 | A1* | 6/2017 | Ogasawara | H01J 37/10 |
| 2018/0158642 | A1 | 6/2018 | Frosien et al. | H01J 37/10 |

FOREIGN PATENT DOCUMENTS

| | | | | |
|---|---|---|---|---|
| JP | 3800343 | 7/2006 | | H01L 21/027 |
| JP | 2010206126 | 9/2010 | | H01L 21/027 |

OTHER PUBLICATIONS

International Search Report and Written Opinion issued in PCT/NL2020/050645, dated Jan. 19, 2021, 13 pages.

Informal Comments by Applicant submitted in PCT/NL2020/050645, dated Feb. 21, 2022, 5 pages.

English translation of Chinese Office Action issued in Appln. Serial No. 202080073321.8, dated Sep. 25, 2024, 14 pages.

English translation of Japanese Office Action issued in Appln. Serial No. 2022-523677, dated Sep. 3, 2024, 5 pages.

* cited by examiner

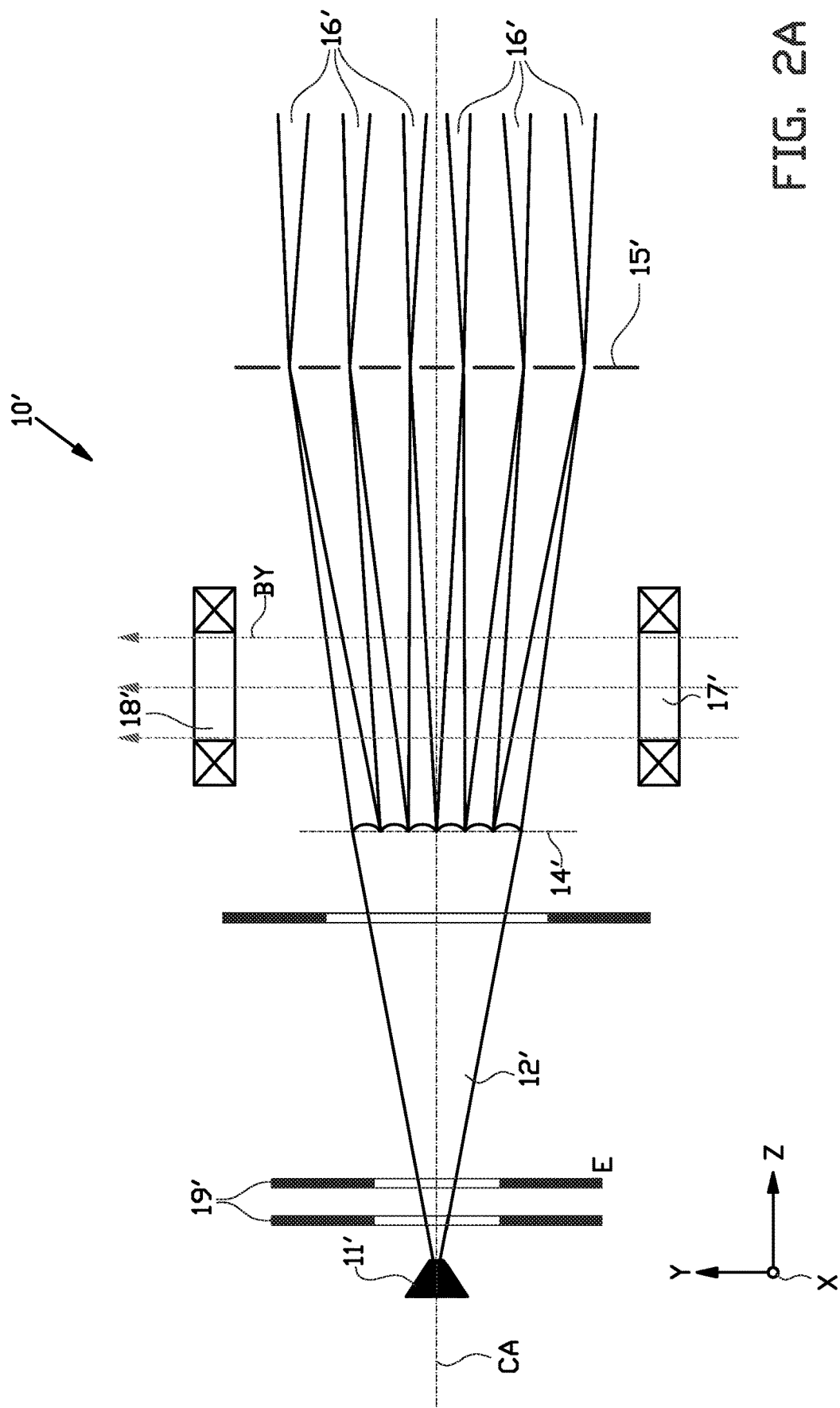

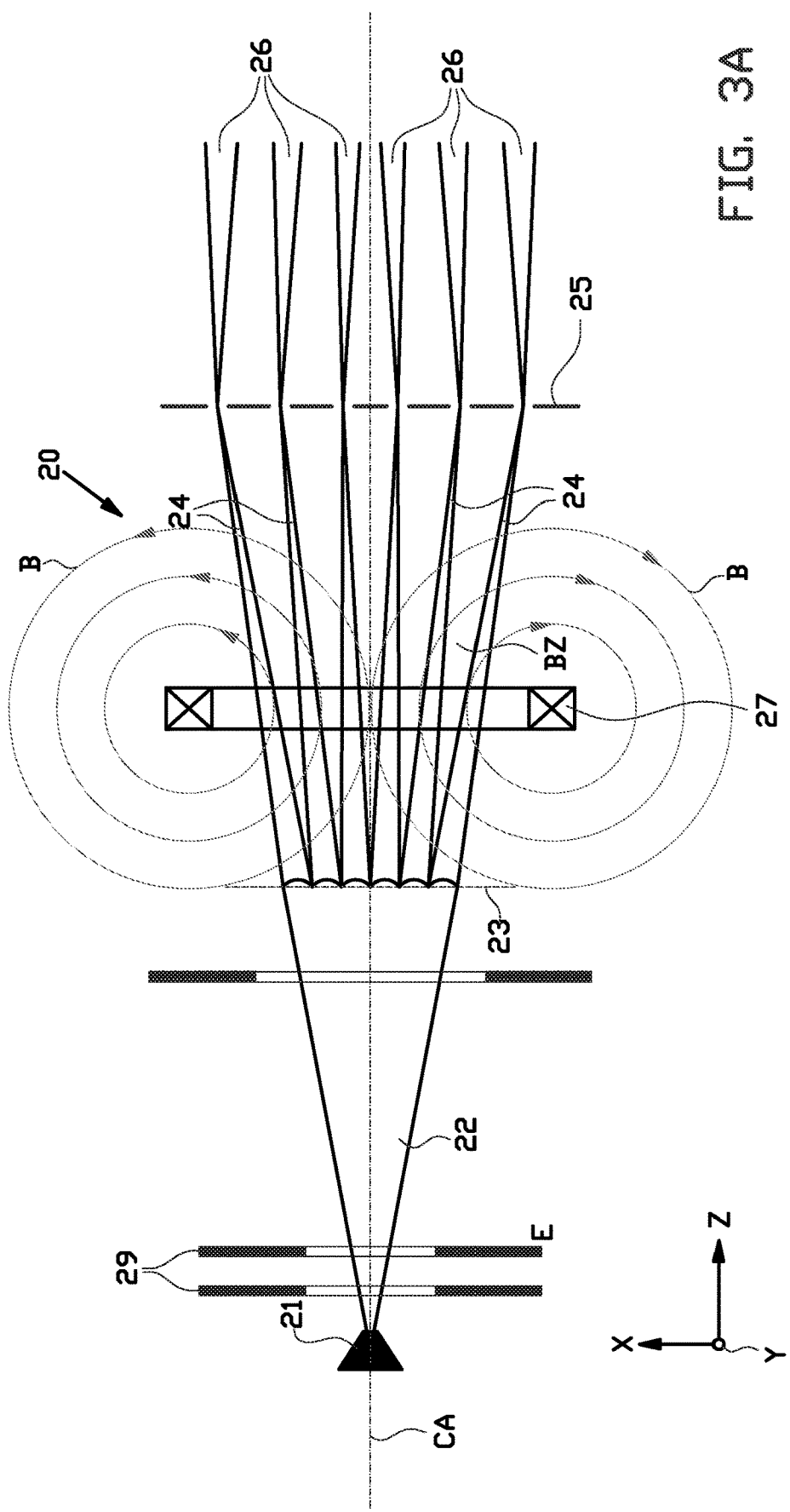

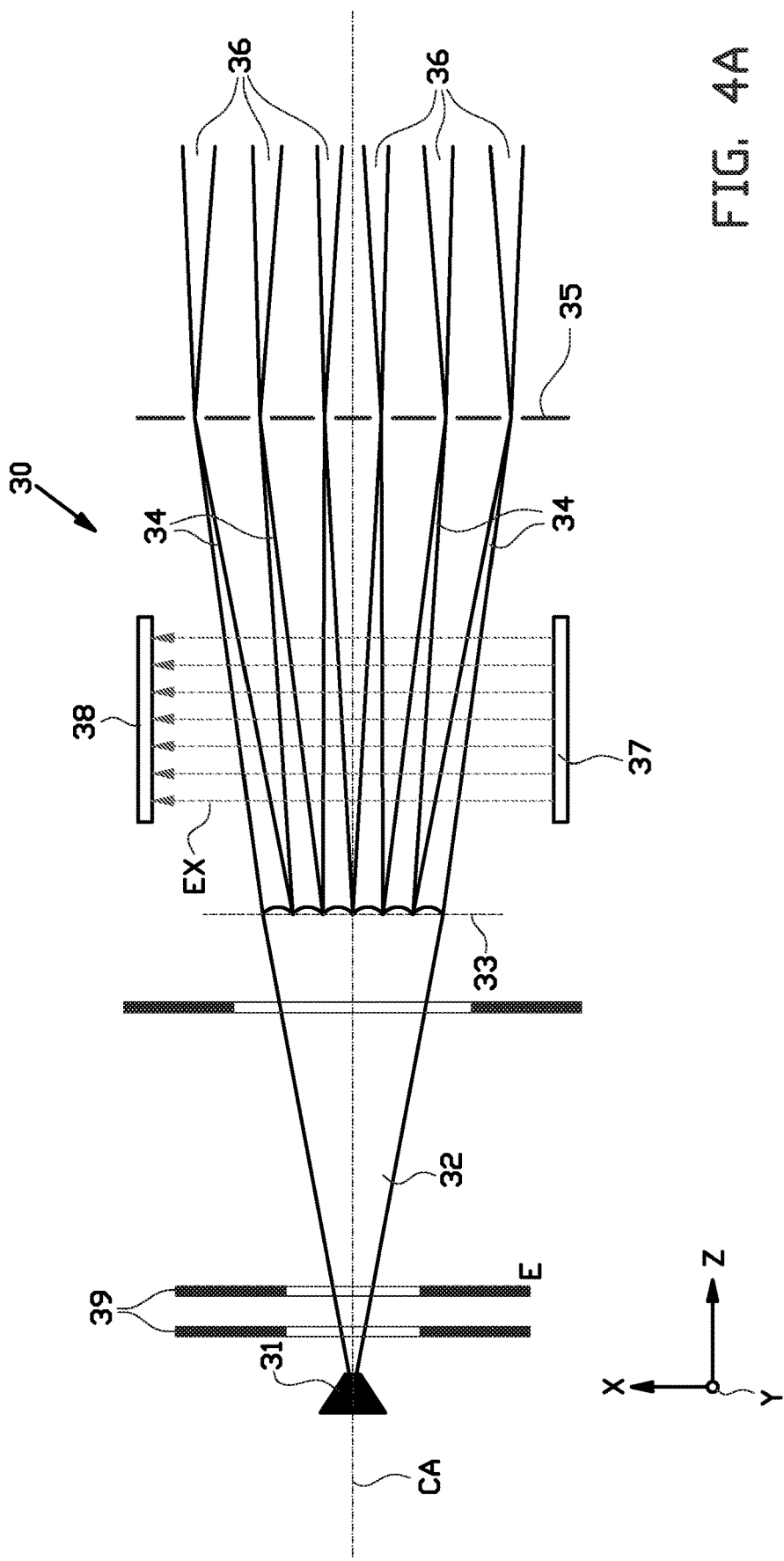

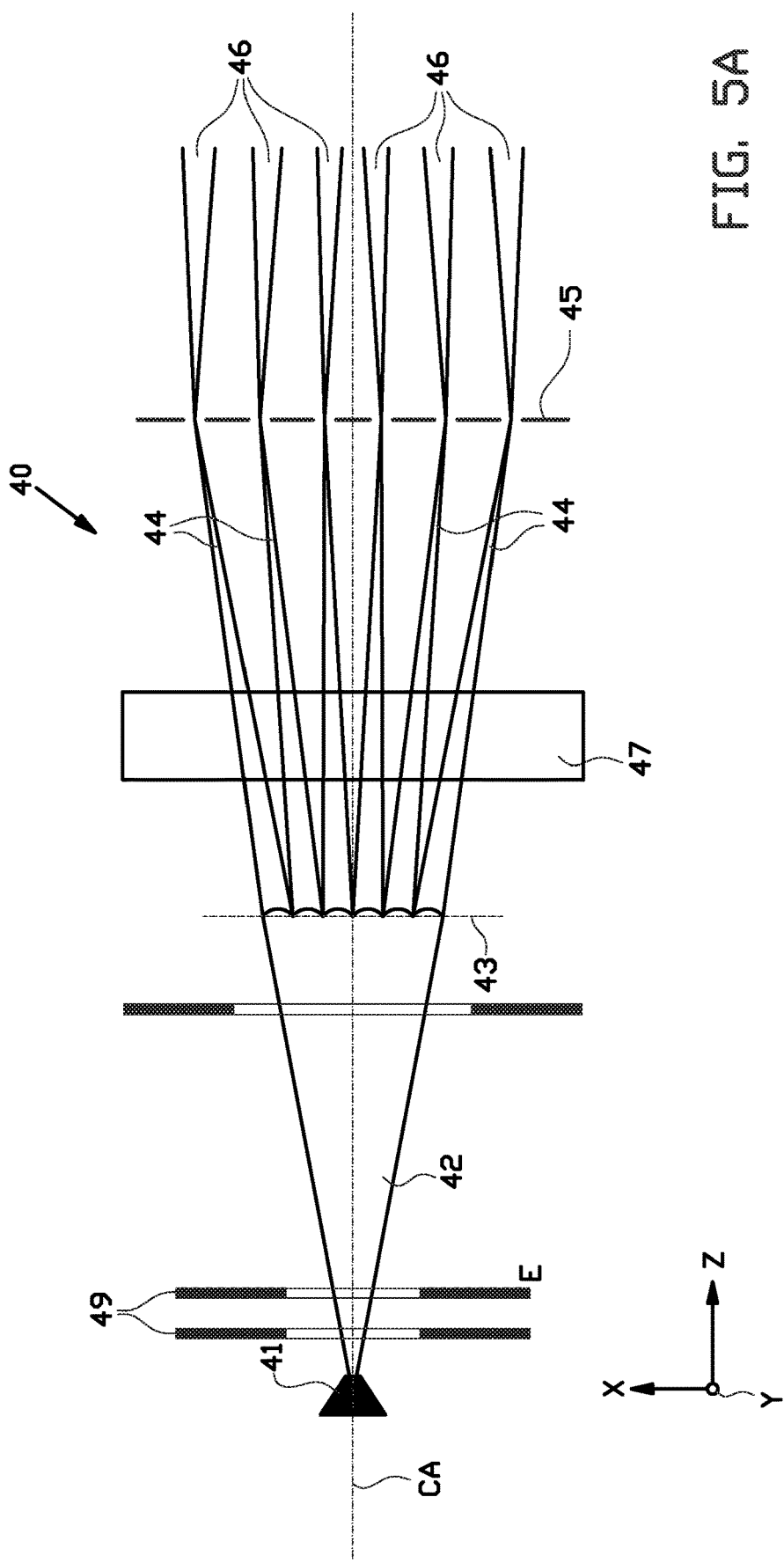

MULTI-BEAM CHARGED PARTICLE SOURCE WITH ALIGNMENT MEANS

Embodiments of the invention relate to an apparatus and a method for generating a plurality of charged particle beamlets.

BACKGROUND

Charged particle beams are used in a variety of systems, like lithography, inspection and imaging systems. Some of these systems use a single charged particle source for generating one charged particle beam, which is subsequently split into a plurality of charged particle beamlets.

In particular, US 2004/0232349 A1 describes an apparatus for generating a plurality of charged particle beamlets, comprising a charged particle source for generating a diverging charged particle beam, a converging means for refracting said diverging charged particle beam, and a lens array comprising a plurality of lenses. Said lens array is arranged between said charged particle source and said converging means.

For applications where the size of the array of the plurality of charged particle beamlets at the plane of the collimator is large, it becomes impractical to use a single electron lens for collimation. As described in US 2004/0232349 A1, a deflector array can be used as a converging means, in particular for collimating the diverging charged particle beamlets. Said deflector array comprises a deflector for each charged particle beamlet, for deflecting said beamlet.

SUMMARY OF THE INVENTION

A disadvantage of the known apparatus for generating a plurality of charged particle beamlets, is that the position of the array of charged particle beamlets needs to be accurately aligned with the position of the collimating device, such as an array of deflectors of the deflector array.

An incorrect alignment with an array of deflectors will result, inter alia, in that not every beamlet traverses through the center of the corresponding deflector of the array of deflectors, and thus an incorrect alignment may generate a deviation from the desired deflection for each beamlet, or even in a blocking of a beamlet when said beamlet misses the aperture of the corresponding deflector.

It is an object to least partially solve at least one of the above-identified disadvantage, at least partially, and/or to provide an alternative apparatus for generating a plurality of charged particle beamlets, which allows for an alignment of the charged particle beamlets with respect to an array of deflectors.

According to a first aspect, an apparatus for generating a plurality of charged particle beamlets is provided, which apparatus comprising:
- a charged particle source for generating a diverging charged particle beam,
- a beam splitter for splitting said charged particle beam in an array of charged particle beamlets,
- a deflector array comprising an array of deflectors comprising one deflector for each charged particle beamlet of said array of charged particle beamlets, wherein the deflector array is configured to at least substantially collimate the array of diverging charged particle beamlets, and
- a beam manipulation device configured for generating electric and/or magnetic fields at least in an area between the charged particle source and the deflector array, wherein apparatus comprises a central axis, wherein the charged particle source, a center of the beam splitter and a center of the deflector array are arranged on the central axis, and wherein the beam manipulation device is configured for generating:
- an electric field substantially parallel and/or perpendicular to the central axis, and/or
- a magnetic field substantially parallel and/or perpendicular to the central axis.

In the apparatus of the present invention, the beam manipulation device allows to manipulate the charged particle beamlets in order to optimize the alignment of the charged particle beamlets on the deflector array. Due to the presence of the manipulation device, the mechanical alignment of the elements of the apparatus for generating a plurality of charged particle beamlets can be less accurate. More importantly, the alignment of the charged particle beamlets can be adjusted during the operation of the apparatus, for example to correct for any thermal expansions of the elements of the apparatus and/or to correct for any drift.

When considering a Cartesian coordinate system with respect to the apparatus having a Z-axis parallel to the central axis, and the X-axis and Y-axis in a plane perpendicular to the central axis, the electric and/or magnetic fields as generated by the beam manipulation device can be assigned as follows:

Using a magnetic field which extends along the Y-axis and/or an electric field which extends along the X-axis, the array of charged particle beamlets can be moved in a direction along the X-axis. By carefully controlling the magnitude of the magnetic and/or electric field the actual position along the X-axis of the array of charged particle beamlets on the deflector array can be controlled in order to bring the array of charged particle beamlets in alignment with the deflector array.

Using a magnetic field which extends along the X-axis and/or an electric field which extends along the Y-axis, the array of charged particle beamlets can be moved in a direction along the Y-axis. By carefully controlling the magnitude of the magnetic and/or electric field the actual position along the Y-axis of the array of charged particle beamlets on the deflector array can be controlled in order to bring the array of charged particle beamlets in alignment with the deflector array.

Using a magnetic field which extends at least partially along the Z-axis, the array of charged particle beamlets can be rotated around the Z-axis. By carefully controlling the magnitude of the magnetic field the actual position around the Z-axis of the array of charged particle beamlets on the deflector array can be controlled in order to bring the array of charged particle beamlets in alignment with the deflector array. It is noted that such a magnetic field is generally created using a coil of electrically conducting wire which is arranged in an XY-plane, preferably with a central axis of the coil arranged on the Z-axis. Since the magnetic field of such a coil warps around electrically conducting wire of the coil, the magnetic field before and after the coil, as view along the Z-axis, is not completely parallel to the Z-axis. Accordingly, such a magnetic field also provides a lensing effect. This lensing effect may be compensated by controlling the divergence of the charged particle beam from the source, for example by adjusting the voltage on the electrodes of the charged particle source, such as the voltage on an extractor electrode.

In addition, by using an electrostatic field and/or a magnetic field which are configure to provide a variation of the field in a direction parallel to the central axis, the pitch between the beamlets of the array of charged particle beamlets can be adjusted.

In a preferred embodiment, the beam manipulation device is configured to combine several of these magnetic and/or electric fields by combining one or more of the embodiments described below. This allows to adjust a deviation of the charged particle beamlets in more than one directional/rotational alignment. The specific arrangement of the beam manipulation device depends, inter alia, on the specific use of the apparatus and/or the required accuracy of alignment in a specific application of the apparatus for generating a plurality charged particle beamlets.

In an embodiment, the beam manipulation device comprises one or more first coils for generating a magnetic field in a first direction substantially perpendicular to the central axis. The apparatus according to this embodiment provides a relatively simple beam manipulation device, which allows to adjust the alignment of the array of charged particle beamlets in case the deviation and/or drift is mainly in a direction perpendicular to the central axis and the first direction.

In an embodiment, the beam manipulation device comprises, in addition to the one or more first coils, one or more second coils for generating a magnetic field in a second direction substantially perpendicular to the central axis and substantially perpendicular to the first direction. The apparatus according to this embodiment provides a beam manipulation device, which allows to adjust the alignment of the array of charged particle beamlets in a plane perpendicular to the central axis, in particular in direction along two orthogonal directions, for example along the X-axis and the Y-axis, as defined above.

In an embodiment, the beam manipulation device comprises a third coil for generating a magnetic field in a direction at least partially along and substantially parallel to the central axis. The apparatus according to this embodiment provides a beam manipulation device, which allows to adjust the alignment of the array of charged particle beamlets with respect to a rotation around the central axis.

It is noted that the magnetic field by the third coil may also provide a change in the pitch between the beamlets of the array of charged particle beamlets. Accordingly, in an embodiment, the third coil is a first third coil, wherein the beam manipulation device further comprises a second third coil which is configured to provide a magnetic field with a variation of the magnetic field in a direction parallel to the central axis, wherein the first coil and the second coil are configured in order to adjust the pitch between the beamlets of the array of charged particle beamlets, preferably without substantially adjusting the rotation around the central axis. By using two third coils the combined effect of rotation and change of pitch can be at least partially disentangled.

In an embodiment, the beam manipulation device comprises one or more first electrodes for generating an electrostatic field in a first direction substantially perpendicular to the central axis. The apparatus according to this embodiment provides a relatively simple beam manipulation device, which allows to adjust the alignment of the array of charged particle beamlets in case the deviation and/or drift is mainly in a direction perpendicular to the central axis and parallel to the first direction.

It is noted that an electrostatic field in a first direction substantially perpendicular to the path along which the charged particles move, provides a force to the charged particles which is substantially parallel to the first direction, whereas a magnetic field in a first direction substantially perpendicular to the path along which the charged particles move, provides a force to the charged particles which is substantially perpendicular to the first direction.

In an embodiment, the beam manipulation device comprises, in addition to the one or more first electrodes, one or more second electrodes for generating an electrostatic field in a second direction substantially perpendicular to the central axis and substantially perpendicular to the first direction. The apparatus according to this embodiment provides a beam manipulation device, which allows to adjust the alignment of the array of charged particle beamlets in a plane perpendicular to the central axis, in particular in direction along the X-axis and the Y-axis.

In an embodiment, the beam manipulation device comprises one or more third electrodes for generating an electrostatic field in a direction along and substantially parallel to the central axis, wherein the one or more third electrodes are configured to provide an electrostatic field with a variation of the electrostatic field in a direction parallel to the central axis in order to adjust the pitch between the beamlets of the array of charged particle beamlets.

It is noted that this latter embodiment can advantageously be combined with an embodiment wherein the beam manipulation device comprises a third coil for generating a magnetic field in a direction at least partially along and substantially parallel to the central axis, as described above. As already indicated above, the magnetic field by the third coil may provide a rotation of the array of charged particle beamlets around the central axis and a change in the pitch between the beamlets of the array of charged particle beamlets. By combining the one or more third electrodes with the coil, the combined effect of rotation and change of pitch by the third coil can be at least partially disentangled.

In addition or alternatively to the generation of magnetic and/or electric fields as described above, the manipulation device can also be configured to generate multipole fields, such as quadrupole or octopole fields. By using for example quadrupole magnetic and/or electric fields, the array of charged particle beamlets can for example be packed more closely together in a first direction and spread out in a second direction, wherein the second direction may be substantially perpendicular to the first direction. Accordingly, the pitch between the charged particle beamlets in the first direction can be decreased, whereas the pitch between the charged particle beamlets in the second direction can be increased.

One or more of these magnetic and/or electric quadrupole fields can be generated using one or more of the embodiments described below:

In an embodiment, the beam manipulation device comprises one or more fourth coils for generating a quadrupole magnetic field in a plane substantially perpendicular to the central axis. In an embodiment, the beam manipulation device comprises four fourth coils, two of which are arranged on opposite sides of the central axis and having a first common coil axis, and the other two are arranged on opposite sides of the central axis and having a second common coil axis which is perpendicular to the first common coil axis, wherein the first and second common coil axis are arranged in a plane which is substantially perpendicular to the central axis. Preferably, the four fourth coils are arranged at substantially the same distance from the central axis.

In a further embodiment, the beam manipulation device comprises two sets of fourth coils, each set is configured for generating a quadrupole magnetic field in a plane substantially perpendicular to the central axis, wherein the first common coil axis of the first set is arranged at an acute angle with respect to the first common coil axis of the second set. In an embodiment the angle between the first common coil axis of the first set and the first common coil axis of the second set is substantially 45 degrees.

In an embodiment, the beam manipulation device comprises one or more fourth electrodes for generating a quadrupole electrostatic field in a plane substantially perpendicular to the central axis. In an embodiment, the beam manipulation device comprises four fourth electrodes, two of which are arranged on opposite sides of the central axis and on a first common electrode axis, and the other two are arranged on opposite sides of the central axis and on a second common electrode axis which is perpendicular to the first common electrode axis, wherein the first and second common electrode axis are arranged in a plane which is substantially perpendicular to the central axis. Preferably, the four fourth electrodes are arranged at substantially the same distance from the central axis.

In a further embodiment, the beam manipulation device comprises two sets of fourth electrodes, each set is configured for generating a quadrupole electrostatic field in a plane substantially perpendicular to the central axis, wherein the first common electrode axis of the first set is arranged at an acute angle with respect to the first common electrode axis of the second set. In an embodiment, the angle between the first common electrode axis of the first set and the first common electrode axis of the second set is substantially 45 degrees.

In addition or alternatively, in said further embodiment, the beam manipulation device comprises a set of fourth coils, which is configured for generating a quadrupole magnetic field in a plane substantially perpendicular to the central axis, wherein the first common coil axis of the set of fourth coils is arranged substantially parallel to the first common electrode axis of the set of fourth electrodes.

It is noted that in a further embodiment, the beam manipulation device may also comprise further coils and/or electrodes for generating higher order multi-pole magnetic and/or electrostatic fields, arranged between the charged particle source and the deflector array or between the charged particle source and the collimator lens.

In an embodiment, the apparatus further comprises a control system for the beam manipulation device, wherein the control system configured for adjusting the electric and/or magnetic fields based on a signal from a sensor, wherein the sensor is configured for measuring a deviation of one or more charged particle beamlets of the array of charged particle beamlets from the desired alignment. Accordingly, the apparatus for generating a plurality of charged particle beamlets can be actively controlled to maintain the desired alignment of the charged particle beamlets. In an embodiment, the sensor is arranged at or near the deflector array or the collimator lens.

In an embodiment, the beam splitter comprises a lens array comprising a plurality of lenses comprising one lens for each charged particle beamlet.

In an alternative embodiment, the apparatus comprises a lens array comprising a plurality of lenses comprising one lens for each charged particle beamlet, wherein the lens array is arranged between the beam splitter and the deflector array.

In an embodiment, the apparatus comprises a collimator lens which is arranged between the beam splitter and the charged particle source, and a converging lens which is arranged between the beam splitter and the deflector array, wherein the converging lens is configured to provide a common cross-over of the plurality of charged particle beamlets in between the converging lens and the deflector array. Preferably, the converging lens and the deflector array are configured to provide a beam expander.

In an alternative embodiment, the apparatus comprises a collimator lens which is arranged between the beam splitter and the charged particle source, and a diverging lens which is arranged between the beam splitter and the deflector array. Preferably, the diverging lens and the deflector array are configured to provide a beam expander. In this embodiment, a common cross-over of the plurality of charged particle beamlets can be circumvented.

By using the collimator, it can be ensured that the charged particle beam which impinges on the beam splitter is a substantially collimated charged particle beam. This further collimator at least substantially prevents problems which occur when splitting a diverging charged particle beam with a substantially planar aperture plate or electrode plate wherein the incoming beam is not passing the aperture plate of electrode plate perpendicular to the plane of the planar aperture plate or electrode plate, as for example described in US 2004/0232349A1.

According to a second aspect, the present invention provides a method for generating a plurality of charged particle beamlets, said method comprising the steps of:
  generating a diverging charged particle beam using a charged particle source,
  splitting said charged particle beam in an array of charged particle beamlets using a beam splitter,
  deflecting substantially each charged particle beamlet of said array of charged particle beamlets using a deflector array comprising an array of deflectors comprising one deflector for each charged particle beamlet, wherein the deflector array is configured to at least substantially collimate the array of diverging charged particle beamlets, and
  generating electric and/or magnetic fields at least in an area between the charged particle source and the deflector array using a beam manipulation device for aligning the array of charged particle beamlets with respect to the array of deflectors,
  wherein apparatus comprises a central axis, wherein the charged particle source, a center of the beam splitter and a center of the deflector array are arranged on the central axis, and wherein the beam manipulation device generates:
  an electric field substantially parallel and/or perpendicular to the central axis and/or
  a magnetic field substantially parallel and/or perpendicular to the central axis.

In the method of the present invention, the beam manipulation device manipulates the charged particle beamlets in order to optimize the alignment of the charged particle beamlets on the deflector array. Due to the presence of the manipulation device, the mechanical alignment of the elements of the apparatus for generating a plurality of charged particle beamlets can be less accurate. More importantly, the alignment of the charged particle beamlets can be adjusted during the operation of the apparatus, for example to correct for any thermal expansions of the elements of the apparatus and/or to correct for any drift. In particular, the electric and/or magnetic field are generated in order to adjust the alignment of the array of charged particle beamlets by providing one or more of:
  a deflection of the array of charged particle beamlets in a first direction substantially perpendicular to the central axis, a deflection of the array of charged particle beamlets in a second direction substantially perpendicular to the first direction and the central axis, a rotation of the array of charged particle beamlets around the central axis, an elongation in a first direction substantially perpendicular to the central axis and a contraction in a second direction substantially perpendicular to the first direction and the central axis of the array of charged particle beamlets, and an elongation or a contraction of the array of charged particle beamlets in a radial direction with respect to the central axis (and thereby changing the pitch between the beamlets of the array of charged particle beamlets).

In an embodiment, the apparatus further comprises a control system for the beam manipulation device, wherein the control system adjusts the electric and/or magnetic fields based on a signal from a sensor, wherein the sensor determines a deviation from the desired alignment of one or more charged particle beamlets of said array of charged particle beamlets. Accordingly, the apparatus for generating a plurality of charged particle beamlets is actively controlled to maintain the desired alignment of the charged particle beamlets. In an embodiment, the sensor is arranged at or near the deflector array or the collimator lens.

In an embodiment, the beam splitter comprises a lens array comprising a plurality of lenses comprising one lens for each charged particle beamlet, wherein each charged particle beamlet of said array of charged particle beamlets is refracted by a lens of the lens array.

In an embodiment, the apparatus comprises a lens array comprising a plurality of lenses comprising one lens for each charged particle beamlet, wherein the lens array is arranged between the beam splitter and the deflector array, wherein each charged particle beamlet of said array of charged particle beamlets is refracted by a lens of the lens array.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DESCRIPTION OF THE INVENTION

Figure 1A:
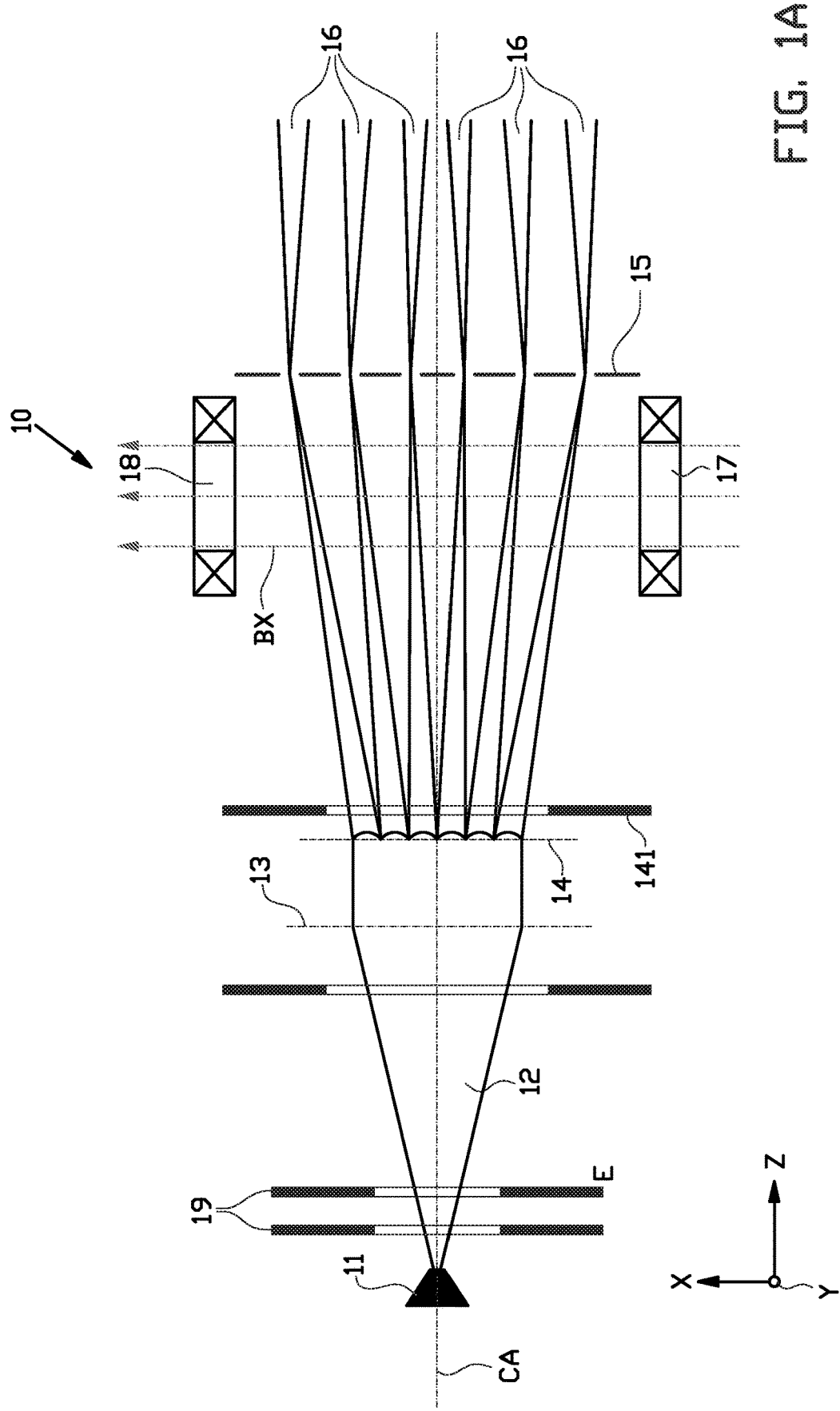
FIGS. 1A and 2A schematically show examples of an apparatus for generating a plurality of charged particle beamlets with a beam manipulation device which is configured for generating a magnetic field substantially perpendicular to a central axis, FIG. 1B schematically shows the apparatus of figure LA in a plane perpendicular to the central axis, FIG. 2B schematically shows the apparatus combining the beam manipulation devices of FIGS. 1A and 2A in a plane perpendicular to the central axis, FIG. 3A schematically shows a further example of an apparatus for generating a plurality of charged particle beamlets with a beam manipulation device which is configured for generating a magnetic field at least partially parallel to a central axis, FIG. 3B schematically shows the apparatus of FIG. 3A in a plane perpendicular to the central axis, FIG. 4A schematically shows a further example of an apparatus for generating a plurality of charged particle beamlets with a beam manipulation device which is configured for generating an electric field substantially perpendicular to a central axis, FIG. 4B schematically shows the apparatus of FIG. 4A in a plane perpendicular to the central axis, FIG. 5A schematically shows a further example of an apparatus for generating a plurality of charged particle beamlets with a beam manipulation device which is configured for generating a quadrupole magnetic or electrostatic field substantially perpendicular to a central axis, FIG. 5B schematically shows a first example of the apparatus of FIG. 5A in a plane perpendicular to the central axis, wherein coils are arranged on the X and Y axis to generate a quadrupole magnetic field, FIG. 5C schematically shows a second example of the apparatus of FIG. 5A in a plane perpendicular to the central axis, wherein the coils are arranged in the XY plane and rotated over 45 degrees in a clock-wise direction with respect to the position of the coils in FIG. 5B, FIG. 5D schematically shows a third example of the apparatus of FIG. 5A in a plane perpendicular to the central axis, wherein electrodes are arranged on the X and Y axis to generate a quadrupole electrostatic field, and FIG. 5E. schematically shows a fourth example of the apparatus of FIG. 5A in a plane perpendicular to the central axis, wherein the electrodes are arranged in the XY plane and rotated over 45 degrees in a clock-wise direction with respect to the position of the electrodes in FIG. 5D.

It is noted that the beam manipulation device according to the invention is preferably configured to combine several magnetic and/or electric fields. This allows to adjust a deviation of the charged particle beamlets in more than one directional/rotational alignment. To more clearly describe examples of beam manipulation devices which allow to adjust the alignment of the beamlets, these various examples are described below separately, but it should be understood that in a beam manipulation device according to the invention, one or more of the embodiments described below are combined.

FIG. 1 shows a first example of an apparatus 10 for generating a plurality of charged particle beamlets 16. The apparatus 10 comprises a charged particle source 11 with extraction electrodes 19 for generating a diverging charged particle beam 12. The diverging charged particle beam 12 is directed onto a collimating lens 13, and subsequently the at least substantially collimated charged particle beam 12 is directed onto a beam splitter 14 for splitting said charged particle beam 12 in an array of charged particle beamlets 16.

In this example, the beam splitter 14, comprises a lens array which is configured for focusing each charged particle beamlet 16. In addition, the lens array is combined with an electrode 141 in order to provide a diverging lens for generating a diverging array of charged particle beamlets 16. The diverging charged particle beamlets 16 are directed to a deflector array 15 comprising an array of deflectors comprising one deflector for each charged particle beamlet 16. The apparatus 10 comprises a central axis CA, wherein the charged particle source 11, a center of the beam splitter 14 and a center of the deflector array 15 are arranged on the central axis CA. The deflector array 15 is configured to deflect substantially each charged particle beamlet 16 in order to provide a substantially collimated array of charged particle beamlets 16. It is noted that the diverging lens, provided by the beam splitter 14 and the electrode 141, and the deflector array 15 together form a beam expander. In the example shown in FIG. 1, the lens array is configured for focusing each charged particle beamlet 16 substantially at the plane of the deflector array 15.

The position of the array of diverging charged particle beamlets 16 needs to be accurately aligned with the position of the array of deflectors of the deflector array 15. In order to assist the alignment and/or to adjust the alignment, the apparatus 10 of the present invention comprises a beam manipulation device comprising a first coil 17 and a second coil 18 which are arranged at opposite sides of the central axis CA. The coils 17, 18 are configured for generating a magnetic field BX in an area between the charged particle source 11 and the deflector array 15, in particular in an area between the beam splitter 14 and the deflector array 15.

Figure 1B:
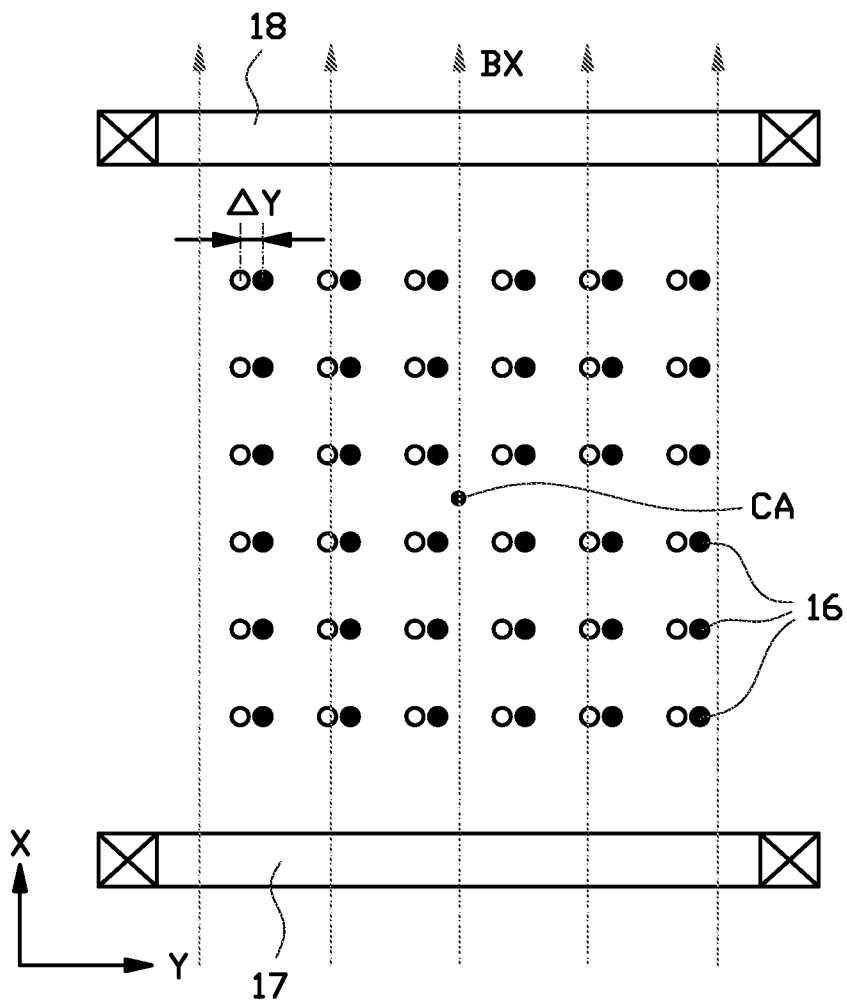

As schematically indicated in FIG. 1, the magnetic field Bx extends substantially in a direction parallel to the X-axis and substantially perpendicular to the central axis CA. In case the charged particle beamlets 16 comprise positive charged particles and the magnetic field BX extends in the direction of the positive X-axis, the magnetic field BX will generate a force on the positive charged particles, which moves the positive charged particles in the direction of the positive Y-axis, as schematically indicated in FIG. 1B.

In the figures, the open circles represent the position of the charged particle beamlets when the magnetic or electrostatic field of the manipulation device is turned off, and the filled circles represent the position of the charged particle beamlets when the magnetic or electrostatic field of the manipulation device is turned on.

It is noted that the combination of the beam splitter 14 and the electrode 141 is configured to generate an electrostatic field in a direction along and substantially parallel to the central axis, and thus are configure to operate as the above identified one or more third electrodes. The beam splitter 14 and the electrode 14 can be arranged to provide an electrostatic field with a variation of the electrostatic field in a direction parallel to the central axis in order to adjust the pitch between the beamlets of the array of charged particle beamlets, in particular at the deflector array 15.

FIG. 2A shows an alternative first example of an apparatus 10' for generating a plurality of charged particle beamlets 16'. The apparatus 10' comprises a charged particle source 11' with extraction electrodes 19' for generating a diverging charged particle beam 12'. The diverging charged particle beam 12' is directed onto a beam splitter 14' for splitting said diverging charged particle beam 12' in an array of charged particle beamlets 16'. The charged particle beamlets 16' are directed to a deflector array 15' comprising an array of deflectors comprising one deflector for each charged particle beamlet 16'. The apparatus 10' comprises a central axis CA, wherein the charged particle source 11', a center of the beam splitter 14' and a center of the deflector array 15' are arranged on the central axis CA. The deflector array 15' is configured to deflect substantially each charged particle beamlet 16' towards the central axis CA, wherein the deflection is configured to increase with the distance to the central axis CA. In particular, the deflector array 15' is configured to deflect substantially each charged particle beamlet 16' in order to provide a substantially collimated array of charged particle beamlets 16'. In the example shown in FIG. 2A, the beam splitter 14', comprises a lens array which is configured for focusing each charged particle beamlet 16' substantially at the plane of the deflector array 15'. Such a system is also described for example in US 2004/0232349 A1, in particular in FIG. 7 thereof.

Again, the position of the array of charged particle beamlets 16' needs to be accurately aligned with the position of the array of deflectors of the deflector array 15'. In order to assist the alignment and/or to adjust the alignment, the apparatus 10' of the present invention comprises a beam manipulation device comprising a first coil 17' and a second coil 18' which are arranged at opposite sides of the central axis CA. The coils 17', 18' are configured for generating a magnetic field BY in an area between the charged particle source 11' and the deflector array 15', in particular in an area between the beam splitter 14' and the deflector array 15'.

In case the charged particle beamlets 16' comprise positive charged particles and the magnetic field BY extends in the direction of the positive Y-axis, the magnetic field BY will generate a force on the positive charged particles, which moves the positive charged particles in the direction of the negative X-axis.

The amount of deflection $\Delta X$ depends, inter alia, on the strength of the magnetic field BY. Accordingly, by controlling the strength of the magnetic field BY, the amount of deflection $\Delta X$ can be controlled so that the array of charged particle beamlets 16' is accurately aligned with the openings in the deflector array 15'.

It is noted that negative charged particles will move in the opposite direction, in the direction of the positive X-axis.

Figure 2B:
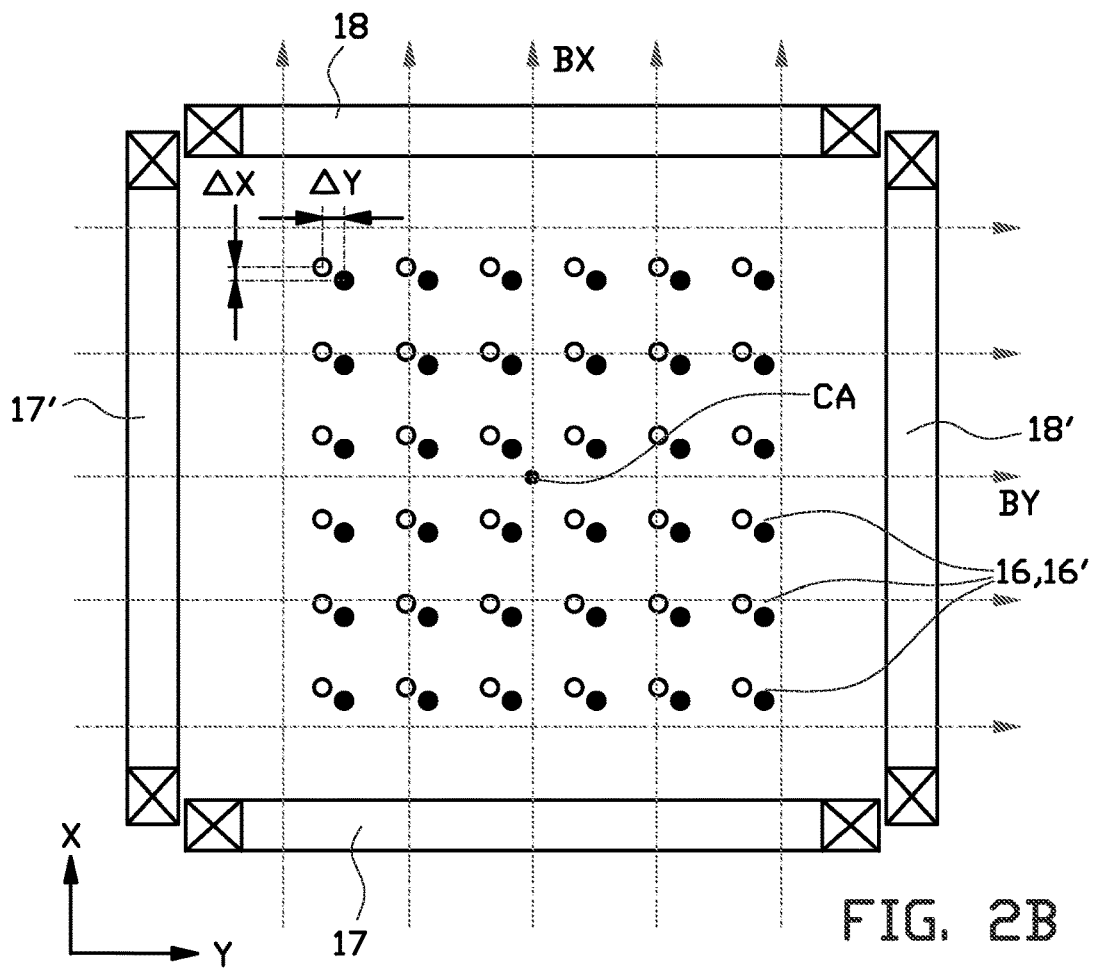

As schematically shown in figure 1A, the coils 17, 18 can be configured for providing a magnetic field BX in a direction parallel to the X-axis and substantially perpendicular to the central axis CA. As schematically shown in FIG. 2A, the coils 17', 18' can be configured for providing a magnetic field BY in a direction parallel to the Y-axis and substantially perpendicular to the central axis CA. By combining the beam manipulation devices of the example of figure 1A and the example of FIG. 2A, the alignment of the beamlets 16' can be adjusted in both the X direction and the Y direction, as schematically indicated in FIG. 2B.

In a second example of the apparatus 20 of the present invention as shown in FIG. 3A, the apparatus 20 comprises a charged particle source 21 with extractor electrodes 29 for generating a diverging charged particle beam 22, a beam splitter 23 for splitting said diverging charged particle beam 22 in an array of diverging charged particle beamlets 24, and a deflector array 25 comprising an array of deflectors comprising one deflector for each charged particle beamlet 24, wherein the charged particle source 21, a center of the beam splitter 23 and a center of the deflector array 25 are arranged on the central axis CA. The deflector array 25 is configured to deflect substantially each charged particle beamlet 24 towards the central axis CA, wherein the deflection is preferably configured to provide a substantially collimated array of charged particle beamlets 26. Preferably, the beam splitter 23 comprises a lens array which is configured for focusing each diverging charged particle beamlet 24 substantially at the plane of the deflector array 25.

Figure 3B:
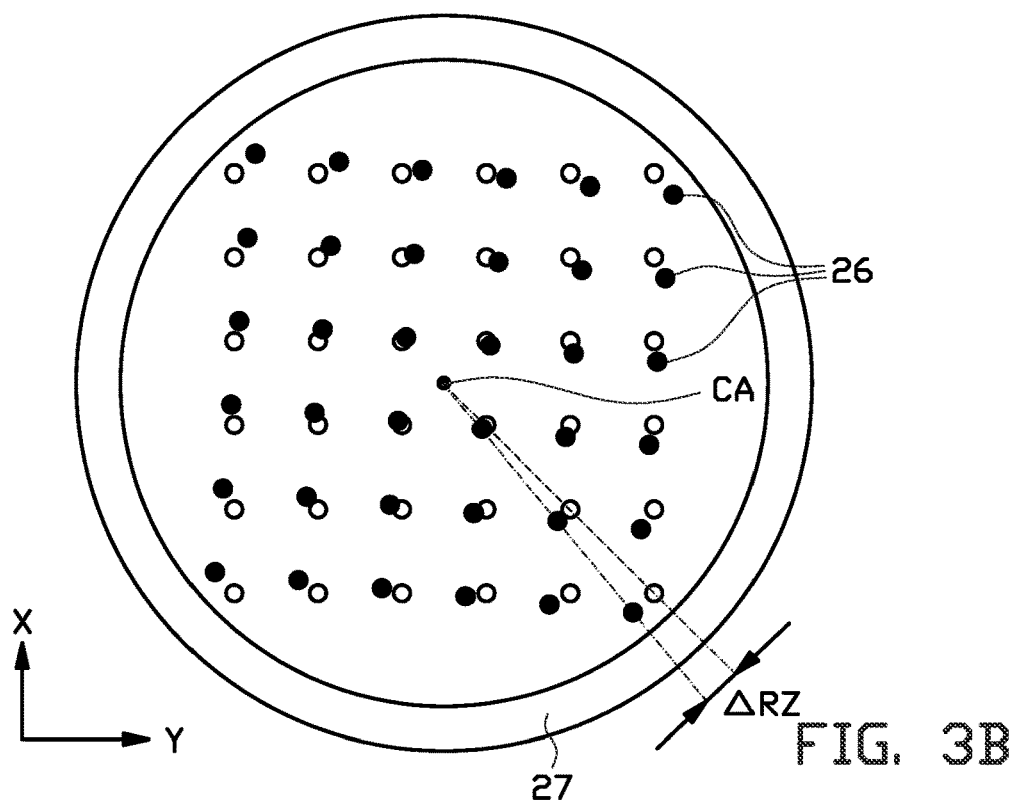

The apparatus 20 further comprises a beam manipulation device comprising a coil 27 which is arranged around the central axis CA, preferably wherein the central axis CA and a central axis of the coil 27 substantially coincide. The coil 27 is configured for generating a magnetic field B which curls around the coil 27 and which is configured for generating a magnetic field BZ at least in the area within the coil 27 and in an area between the charged particle source 21 and the deflector array 25, in particular in an area between the beam splitter 23 and the deflector array 25. In use, the magnetic field BZ will generate a force on the charged particles, which provides a rotation $\Delta RZ$ of the array of charged particle beamlets 24 around the central axis CA as schematically indicated in FIG. 3B. The amount of rotation ΔRZ depends, inter alia, on the strength of the magnetic field BZ. Accordingly, by controlling the strength of the magnetic field BZ, the amount of rotation ΔRZ can be controlled so that the array of charged particle beamlets 26 is accurately aligned with the openings in the deflector array 25.

It is noted that an array of charged particle beamlets with negative charged particles will rotate in the opposite direction with respect to the rotation of an array of charged particle beamlets with positive charged particles, as shown in FIG. 3B.

It is further noted that the magnetic field on one side adjacent to the coil 27, curls toward the central axis CA, and on the other side adjacent to the coil 27, curls away from the central axis CA. Accordingly, the magnetic field before and after the coil 27, as view along the Z-axis, is not completely parallel to the Z-axis. Such a magnetic field provides an additional lensing effect. This lensing effect may be compensated by controlling the divergence of the charged particle beam 22 from the source 21, for example by adjusting the voltage on the electrodes of the charged particle source 21, such as the voltage on an extractor electrode 29.

In a third example of the apparatus 30 of the present invention, as shown in FIG. 4A, the apparatus 30 comprises a charged particle source 31 with extractor electrodes 39 for generating a diverging charged particle beam 32, a beam splitter 33 for splitting said diverging charged particle beam 32 in an array of diverging charged particle beamlets 34, and a deflector array 35 comprising an array of deflectors comprising one deflector for each charged particle beamlet 34. The charged particle source 31, a center of the beam splitter 33 and a center of the deflector array 35 are arranged on the central axis CA. The deflector array 35 is configured to deflect substantially each charged particle beamlet 34 towards the central axis CA, wherein the deflection is preferably configured to provide a substantially collimated array of charged particle beamlets 36. Preferably, the beam splitter 33 comprises a lens array which is configured for focusing each diverging charged particle beamlet 34 substantially at the plane of the deflector array 35.

In order to assist the alignment and/or to adjust the alignment, the apparatus 30 of this example comprises a beam manipulation device comprising a first electrode 37 and a second electrode 38 which are arranged at opposite sides of the central axis CA. The electrodes 37, 38 are configured for generating an electric field EX in an area between the charged particle source 31 and the deflector array 35, in particular in an area between the beam splitter 33 and the deflector array 35.

Figure 4B:
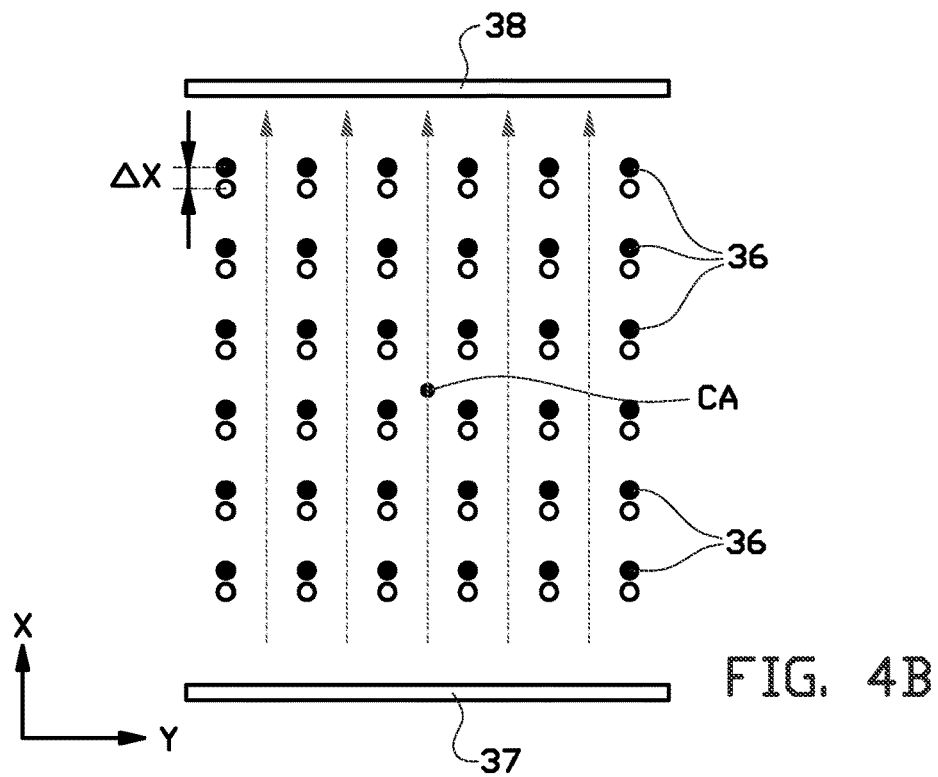

As schematically shown in FIG. 4A, the electrodes 37, 38 can be configured for providing an electric field EX in a direction parallel to the X-axis and substantially perpendicular to the central axis CA. In case the charged particle beamlets 34 comprises positive charged particles and the electric field EX extends in the direction of the positive X-axis, the electric field EX will generate a force on the positive charged particles, which moves the positive charged particles in the direction of the positive X-axis, as schematically indicated in FIG. 4B. The amount of deflection ΔX depends, inter alia, on the strength of the electric field EX. Accordingly, by controlling the strength of the electric field EX, the amount of deflection ΔX can be controlled so that the array of charged particle beamlets 36 is accurately aligned with the openings in the deflector array 35.

It is noted that negative charged particles will move in the opposite direction, in the direction of the negative X-axis.

It is further noted that in a similar way, the apparatus 30 can also be provided with electrodes which generate an electric field in the Y direction, for example in the direction of the positive Y-axis. In case the charged particle beamlets 34 comprises positive charged particles, the electric field which extends in the direction of the positive Y-axis will generate a force on the positive charged particles, which moves the positive charged particles in the direction of the positive Y-axis.

In a fourth example of the apparatus 40 of the present invention as shown in FIG. 5A, the apparatus 40 comprises a charged particle source 41 for generating a diverging charged particle beam 42, a beam splitter 43 for splitting said diverging charged particle beam 42 in an array of diverging charged particle beamlets 44, and a deflector array 45 comprising an array of deflectors comprising one deflector for each charged particle beamlet 44, wherein the charged particle source 41, a center of the beam splitter 43 and a center of the deflector array 45 are arranged on the central axis CA. The deflector array 45 is configured to deflect substantially each charged particle beamlet 44 towards the central axis CA, wherein the deflection is preferably configured to provide a substantially collimated array of charged particle beamlets 46. Preferably, the beam splitter 43 comprises a lens array which is configured for focusing each diverging charged particle beamlet 44 substantially at the plane of the deflector array 45.

Figure 5B:
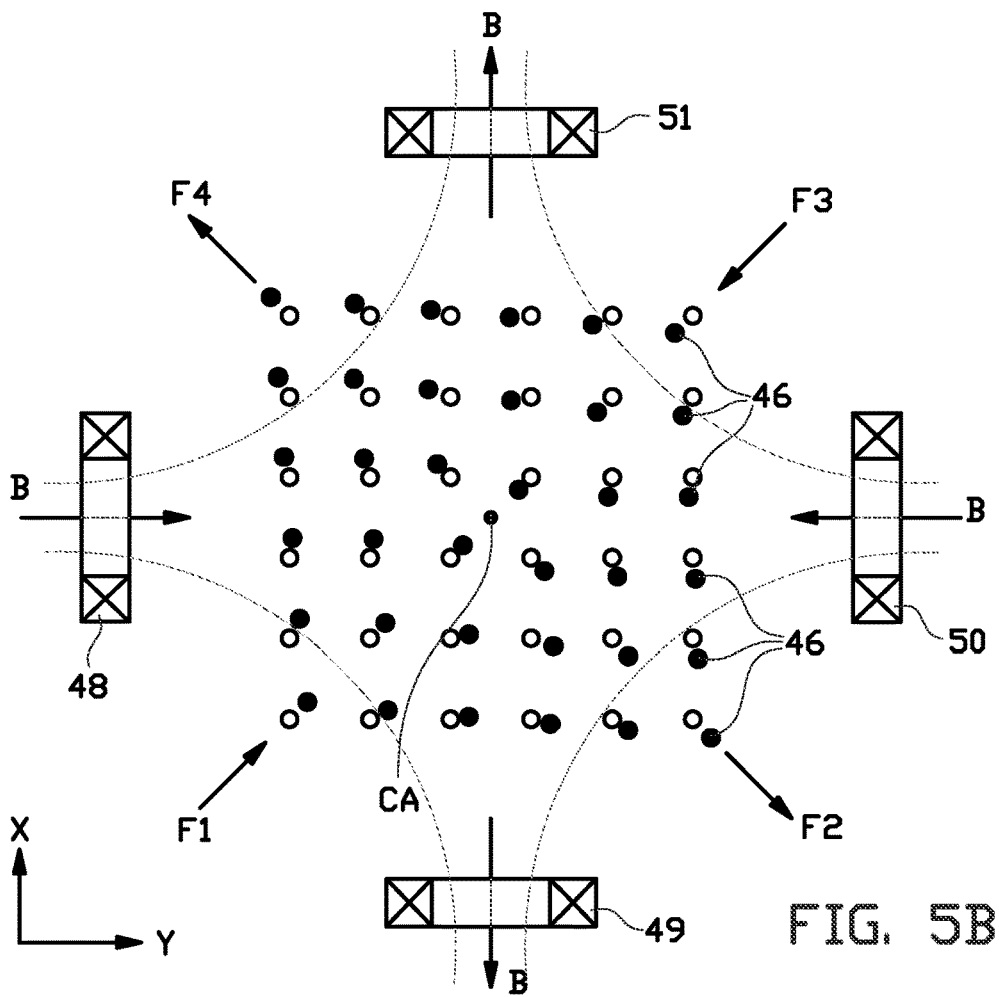

In order to assist the alignment and/or to adjust the alignment, the apparatus 40 of this example comprises a beam manipulation device comprising a quadrupole deflector 47. In this particular example, the quadrupole deflector 47 comprises a set of coils, in particular coils 48, 49, 50, 51 which are arranged around the central axis CA and in a plane perpendicular to the central axis CA, in particular all at the same distance from the central axis CA, as schematically shown in FIG. 5B. The coils 48, 49, 50, 51 are configured for generating a quadrupole magnetic field in an area between the charged particle source 41 and the deflector array 45, in particular in an area between the beam splitter 43 and the deflector array 45.

As schematically shown in FIG. 5B, the coils 48, 49, 50, 51 can be configured so that each one provides a magnetic field B in a direction towards or away from the array of charged particles 46. The combined magnetic fields B of the coils 48, 49, 50, 51, will generate:

a. a force F1 between the first and second coils 48, 49 on the positive charged particles, which push the positive charged particles in a direction substantially parallel to a diagonal in the +X, +Y direction, b. a force F2 between the second and third coils 49, 50 on the positive charged particles, which push the positive charged particles in a direction substantially parallel to a diagonal in the −X, +Y direction, c. a force F3 between the third and fourth coils 50, 51 on the positive charged particles, which push the positive charged particles in a direction substantially parallel to a diagonal in the −X, −Y direction, and d. a force F4 between the fourth and first coils 51, 48 on the positive charged particles, which push the positive charged particles in a direction substantially parallel to a diagonal in the +X, −Y direction.

Accordingly, the quadrupole deflector 47 provides a compression of the array in a direction parallel to the diagonal in the +X, +Y direction (along the F1, F3 direction) and an expansion of the array in a direction parallel to the diagonal in the −X, Y direction (along the F2, F4 direction), as schematically shown in FIG. 5B. The amount of extension and compression depends, inter alia, on the strength of the magnetic fields B. Accordingly, by controlling the strength of the magnetic fields B, the amount of extension and compression can be controlled so that the array of charged particle beamlets 46 is accurately aligned with the openings in the deflector array 45.

It is noted that when the coils 48, 49, 50, 51 are driven to provide magnetic fields B in the opposite direction of the magnetic fields shown in FIG. 5B, the forces on the charged particles will also act in the opposite direction of the forces shown in FIG. 5B.

It is further noted that negative charged particles will move in the opposite direction, thus the extension will be parallel to the F1, F3 direction and the compression will be parallel to the F2, F4 direction.

Figure 5C:
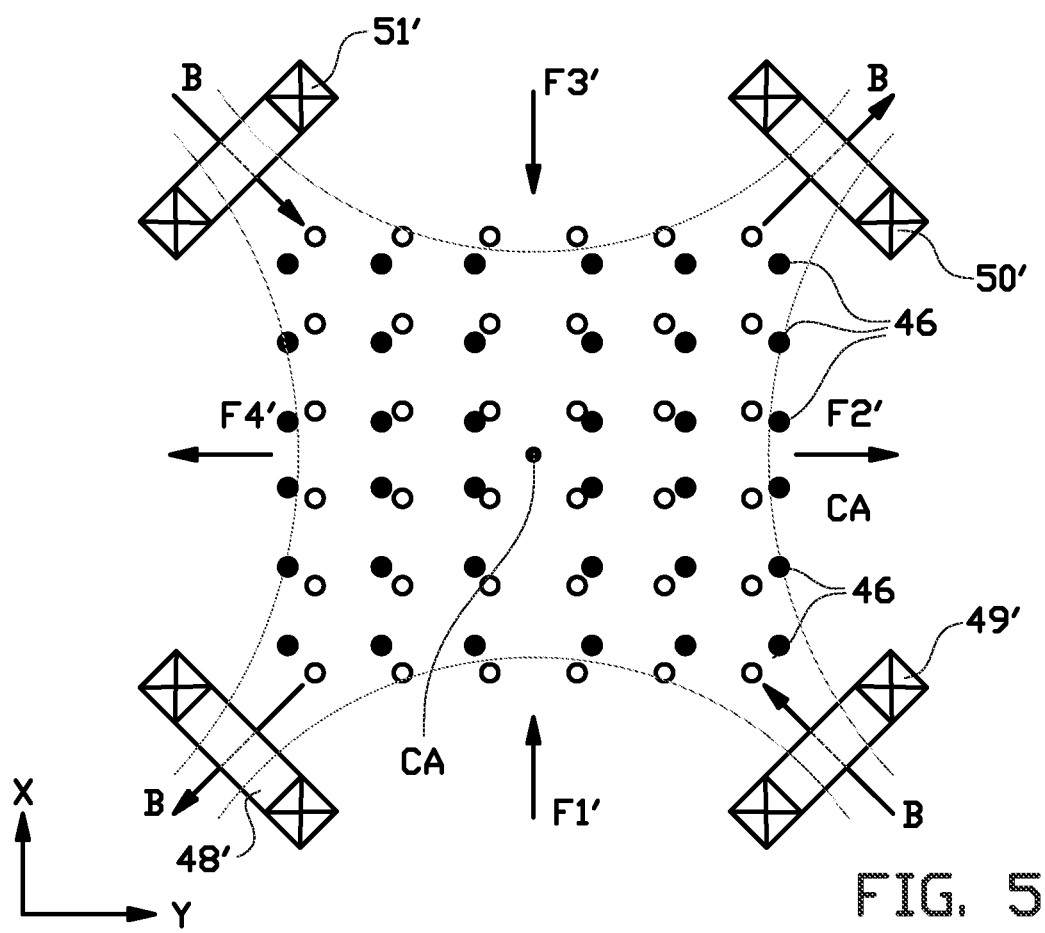

In addition or alternatively, the quadrupole deflector 47 comprises a second set of coils, in particular coils 48', 49', 50', 51' which are arranged around the central axis CA, in particular all at the same distance from the central axis CA, as schematically shown in FIG. 5C. The coils 48', 49', 50', 51' are configured for generating a quadrupole magnetic field in an area between the charged particle source 41 and the deflector array 45, in particular in an area between the beam splitter 43 and the deflector array 45.

As schematically shown in FIG. 5C, the coils 48', 49', 50', 51' can be configured so that each one provides a magnetic field B in a direction towards or away from the array of charged particles 46. The combined magnetic fields B of the coils 48', 49', 50', 51', will generate:
  a. a force F1' between the first and second coils 48', 49' on the positive charged particles, which push the positive charged particles in a direction substantially parallel to the +X direction,
  b. a force F2' between the second and third coils 49', 50' on the positive charged particles, which push the positive charged particles in a direction substantially parallel to the +Y direction,
  c. a force F3' between the third and fourth coils 50', 51' on the positive charged particles, which push the positive charged particles in a direction substantially parallel to the −X direction, and
  d. a force F4' between the fourth and first coils 51', 48' on the positive charged particles, which push the positive charged particles in a direction substantially parallel to the −Y direction.

Accordingly, the quadrupole deflector 47 provides a compression of the array of charged particle beamlets 46 in a direction parallel to the X-axis and an expansion of the array in a direction parallel to the Y-axis, as schematically shown in FIG. 5C. The amount of extension and compression depends, inter alia, on the strength of the magnetic fields B. Accordingly, by controlling the strength of the magnetic fields B, the amount of extension and compression can be controlled so that the array of charged particle beamlets 46 is accurately aligned with the openings in the deflector array 45.

It is noted that when the coils 48', 49', 50', 51' are driven to provide magnetic fields B in the opposite direction of the magnetic fields shown in FIG. 5C, the forces on the charged particle beamlets 46 will also act in the opposite direction of the forces shown in FIG. 5C.

It is further noted that negative charged particle beamlets will move in the opposite direction of the example of FIG. 5C, thus the extension will be parallel to the X-axis and the compression will be parallel to the Y-axis.

Figure 5D:
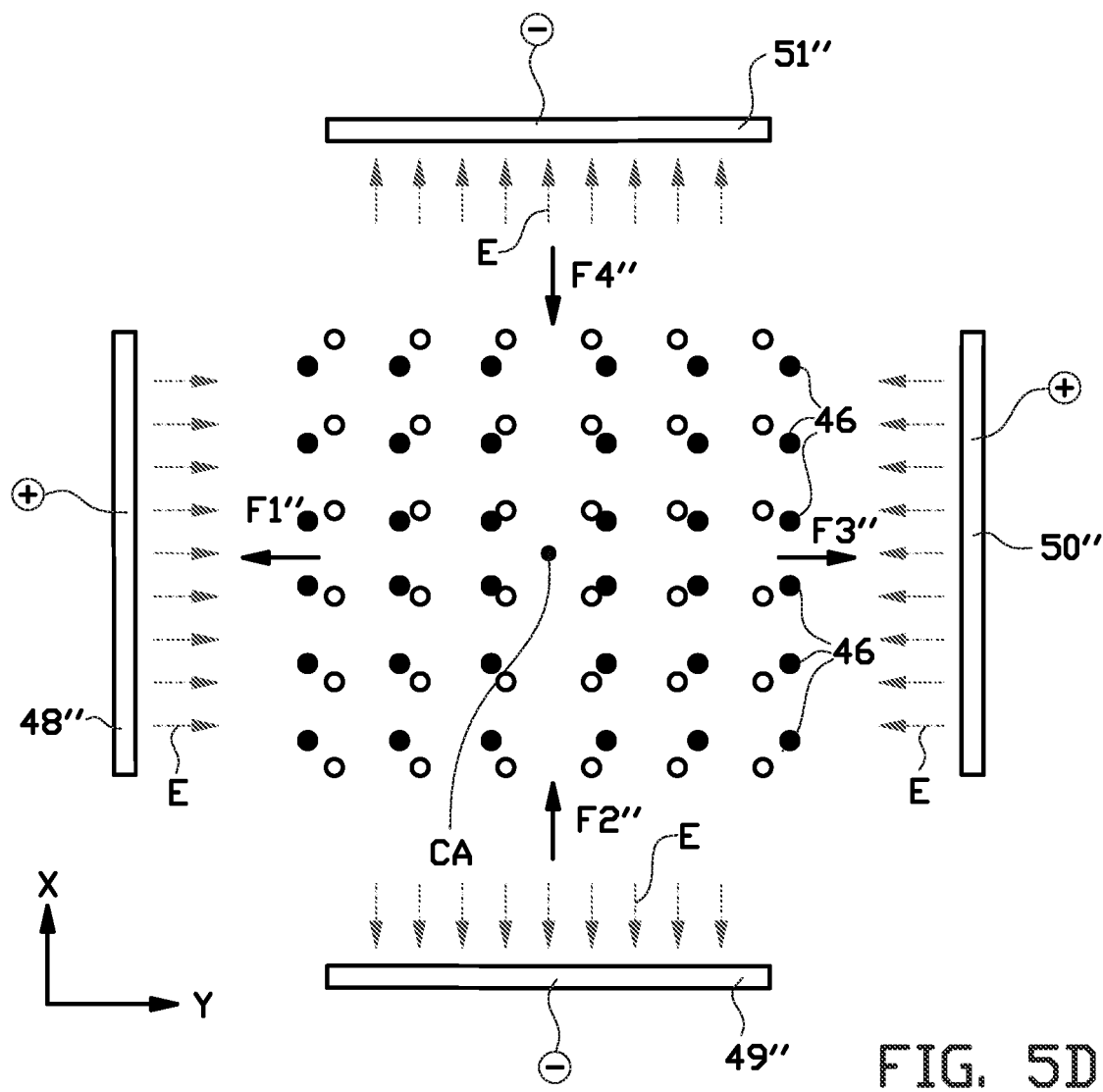

In addition or alternatively, the quadrupole deflector 47 comprises a set of four electrodes, in particular electrodes 48", 49", 50", 51" which are arranged around the central axis CA, in particular all at the same distance from the central axis CA, as schematically shown in FIG. 5D. The electrodes 48", 49", 50", 51" are configured for generating a quadrupole electrostatic field in an area between the charged particle source 41 and the deflector array 45, in particular in an area between the beam splitter 43 and the deflector array 45.

As schematically shown in FIG. 5D, the electrodes 48", 49", 50", 51" can be configured so that each one provides an electrostatic field E in a direction towards or away from the array of charged particles 46". When providing the electrodes with the potentials as schematically shown in FIG. 5D, the combined electrostatic fields E of the electrodes 48", 49", 50", 51", will generate:
  a. a force F1" which pulls negative charged particles near the electrode 48" in a direction substantially parallel to the −Y direction,
  b. a force F2" which pushes negative charged particles near the electrode 49" in a direction substantially parallel to the +X direction,
  c. a force F3" which pulls negative charged particles near the electrode 50" in a direction substantially parallel to the +Y direction, and
  d. a force F4" which pushes negative charged particles near the electrode 51" in a direction substantially parallel to the −X direction.

Accordingly, the quadrupole deflector 47 provides a compression of the array of negative charged particle beamlets 46" in a direction parallel to the X axis and an expansion of the array in a direction parallel to the Y axis, as schematically shown in FIG. 5D. The amount of extension and compression depends, inter alia, on the strength of the electrostatic fields E. Accordingly, by controlling the strength of the electrostatic fields E, the amount of extension and compression can be controlled so that the array of charged particle beamlets 46 is accurately aligned with the openings in the deflector array 45.

It is noted that when the electrodes 48", 49", 50", 51" are driven to provide electrostatic fields E in the opposite direction of the electrostatic fields shown in FIG. 5D, the forces on the negative charged particle beamlets will also act in the opposite direction of the forces shown in FIG. 5D.

It is further noted that positive charged particle beamlets will move in the opposite direction of the example showed in FIG. 5D, thus the extension will be parallel to the X-axis and the compression will be parallel to the Y-axis, when using the same arrangement of electrostatic fields E as shown in FIG. 5D.

Figure 5E:
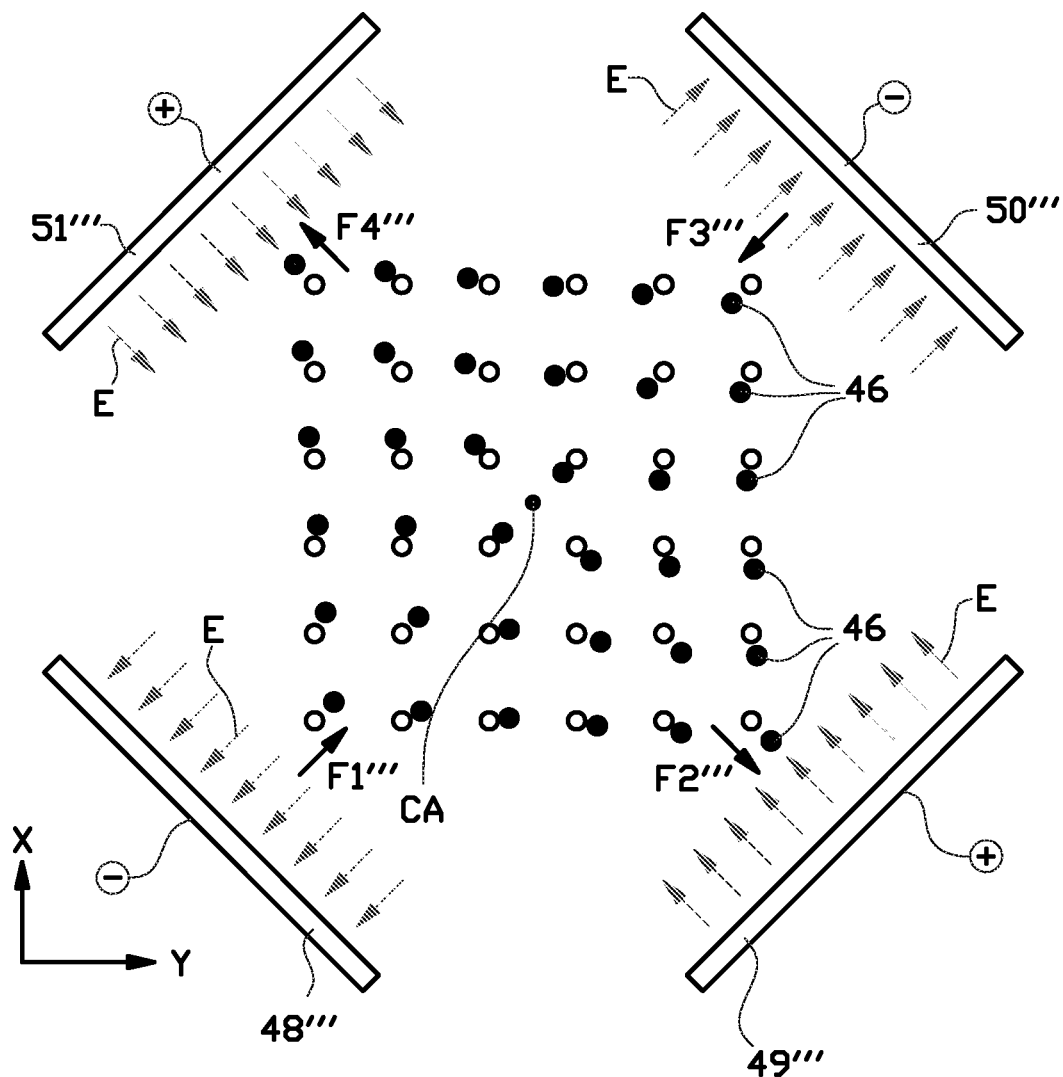

In addition or alternatively, the quadrupole deflector 47 comprises a set of four electrodes, in particular electrodes 48''', 49''', 50''', 51''' which are arranged around the central axis CA, in particular all at the same distance from the central axis CA, as schematically shown in FIG. 5E. The electrodes 48''', 49''', 50''', 51''' are arranged in the XY plane and rotated over 45 degrees in a clock-wise direction with respect to the position of the electrodes 48", 49", 50", 51" in FIG. 5D. When providing the electrodes 48''', 49''', 50''', 51''' with the potentials as shown in FIG. 5E, the quadrupole deflector 47 provides a compression of the array in a direction parallel to the diagonal in the +X, +Y direction (parallel to the F1''' and F3''' direction) and an expansion of the array in a direction parallel to the diagonal in the −X, +Y direction (parallel to the F2''' and F4''' direction). The amount of extension and compression depends, inter alia, on the strength of the electrostatic fields E. Accordingly, by controlling the strength of the electrostatic fields E, the amount of extension and compression can be controlled so that the array of charged particle beamlets 46''' is accurately aligned with the openings in the deflector array 45.

It is noted that the exemplary embodiments of FIGS. 5B, 5C, 5D and 5E can be used individually or in combination in a quadrupole deflector 47 according to the invention.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

As indicated above, the manipulation device according to the invention preferably combines one or more of the examples presented above in order to provide the desired possibilities for correcting the trajectory of the charged particle beams, in particular to align the charged particle beams on the deflector array.

Furthermore, the manipulation devices 27, 38 and 47 of FIGS. 3A, 4A, 5A, 5B, 5C, 5D and 5E, respectively, can also be used and/or combined in the beam expander of FIG. 1.

In summary, the invention relates to an apparatus and method for generating a plurality of substantially collimated charged particle beamlets. The apparatus comprises a charged particle source for generating a diverging charged particle beam, a beam splitter for splitting said charged particle beam in an array of charged particle beamlets, a deflector array comprising an array of deflectors comprising one deflector for each charged particle beamlet of said array of charged particle beamlets, wherein the deflector array is configured for substantially collimating the array of diverging charged particle beamlets. The apparatus further comprises a beam manipulation device configured for generating electric and/or magnetic fields at least in an area between the charged particle source and the deflector array. The apparatus comprises a central axis, and the beam manipulation device is configured for generating electric and/or magnetic fields substantially parallel to the central axis and substantially perpendicular to the central axis.

The invention claimed is:

1. An apparatus for generating a plurality of charged particle beamlets, comprising:
   a charged particle source for generating a diverging charged particle beam,
   a beam splitter for splitting said charged particle beam in an array of charged particle beamlets,
   a deflector array comprising an array of deflectors comprising one deflector for each charged particle beamlet of said array of charged particle beamlets, wherein the deflector array is configured for at least substantially collimating the array of diverging charged particle beamlets, and
   a beam manipulation device configured for generating electric and/or magnetic fields at least in an area between the charged particle source and the deflector array, wherein the electric and/or magnetic fields are configured for optimizing an alignment of the charged particle beamlets on the deflector array,
   wherein apparatus comprises a central axis, wherein the charged particle source, a center of the beam splitter and a center of the deflector array are arranged on the central axis, and wherein the beam manipulation device is configured for generating:
   an electric field substantially perpendicular to the central axis, and/or
   a magnetic field substantially perpendicular to the central axis.

2. The apparatus according to claim 1, wherein the apparatus further comprises a control system for controlling the beam manipulation device, wherein the control system is configured for adjusting the electric and/or magnetic fields based on a signal from a sensor, wherein the sensor is configured for measuring a deviation of one or more charged particle beamlets of the array of charged particle beamlets from a desired alignment.

3. The apparatus according to claim 1, wherein the beam manipulation device comprises one or more first coils for generating a magnetic field in a first direction substantially perpendicular to the central axis.

4. The apparatus according to claim 3, wherein the beam manipulation device comprises one or more second coils for generating a magnetic field in a second direction substantially perpendicular to the central axis and substantially perpendicular to the first direction.

5. The apparatus according to claim 1, wherein the beam manipulation device comprises a third coil for generating a magnetic field in a direction along and substantially parallel to the central axis.

6. The apparatus according to claim 5, wherein the third coil is a first third coil, wherein the beam manipulation device further comprises a second third coil which is configured for providing a magnetic field with a variation of the magnetic field in a direction parallel to the central axis, wherein the first third coil and the second third coil are configured for adjusting the pitch between the beamlets of the array of charged particle beamlets.

7. The apparatus according to claim 6, wherein the first third coil and the second third coil are configured for adjusting the pitch between the beamlets of the array of charged particle beamlets without substantially adjusting the rotation around the central axis.

8. The apparatus according to claim 1, wherein the beam manipulation device comprises one or more fourth coils configured for generating a quadrupole magnetic field in a plane substantially perpendicular to the central axis.

9. The apparatus according to claim 8, wherein the beam manipulation device comprises a set of four fourth coils, two of which are arranged on opposite sides of the central axis and having a first common coil axis, and the other two are arranged on opposite sides of the central axis and having a second common coil axis which is perpendicular to the first common coil axis, wherein the first and second common coil axis are arranged in a plane which is substantially perpendicular to the central axis.

10. The apparatus according to claim 9, wherein the four fourth coils are arranged at substantially the same distance from the central axis.

11. The apparatus according to claim 9, wherein the beam manipulation device comprises two sets of fourth coils, each set is configured for generating a quadrupole magnetic field in a plane substantially perpendicular to the central axis, wherein the first common coil axis of the first set is arranged at an acute angle with respect to the first common coil axis of the second set.

12. The apparatus according to claim 11, wherein the acute angle between the first common coil axis of the first set and the first common coil axis of the second set is substantially 45 degrees.

13. The apparatus according to claim 1, wherein the beam manipulation device comprises one or more first electrodes for generating an electrostatic field in a first direction substantially perpendicular to the central axis.

14. The apparatus according to claim 13, wherein the beam manipulation device comprises one or more second electrodes for generating an electrostatic field in a second direction substantially perpendicular to the central axis and substantially perpendicular to the first direction.

15. The apparatus according to claim 1, wherein the beam manipulation device comprises one or more third electrodes for generating an electrostatic field in a direction along and substantially parallel to the central axis, wherein the one or more third electrodes are configured to provide an electrostatic field with a variation of the electrostatic field in a direction parallel to the central axis in order to adjust the pitch between the beamlets of the array of charged particle beamlets.

16. The apparatus according to claim 1, wherein the beam manipulation device comprises one or more fourth electrodes for generating a quadrupole electrostatic field in a plane substantially perpendicular to the central axis.

17. The apparatus according to claim 16, wherein the beam manipulation device comprises a set of four fourth electrodes, two of which are arranged on opposite sides of the central axis and on a first common electrode axis, and the other two are arranged on opposite sides of the central axis and on a second common electrode axis which is perpendicular to the first common electrode axis, wherein the first and second common electrode axis are arranged in a plane which is substantially perpendicular to the central axis.

18. The apparatus according to claim 17, wherein the first and second common electrode axis are arranged in a plane which is substantially perpendicular to the central axis, wherein the four fourth electrodes are arranged at substantially the same distance from the central axis.

19. The apparatus according to claim 17, wherein the beam manipulation device comprises two sets of fourth electrodes, each set is configured for generating a quadrupole electrostatic field in a plane substantially perpendicular to the central axis, wherein the first common electrode axis of the first set is arranged at an acute angle with respect to the first common electrode axis of the second set.

20. The apparatus according to claim 19, wherein the acute angle between the first common electrode axis of the first set and the first common electrode axis of the second set is substantially 45 degrees.

21. The apparatus according to claim 1,
wherein the beam splitter comprises a lens array comprising a plurality of lenses comprising one lens for each charged particle beamlet, or
wherein the apparatus comprises a lens array comprising a plurality of lenses comprising one lens for each charged particle beamlet, wherein the lens array is arranged between the beam splitter and the deflector array or between the beam splitter and the collimator lens.

22. A method for generating a plurality of charged particle beamlets, comprising the steps of:
generating a diverging charged particle beam using a charged particle source,
splitting said charged particle beam in an array of charged particle beamlets using a beam splitter,
deflecting substantially each charged particle beamlet of said array of charged particle beamlets using a deflector array comprising an array of deflectors comprising one deflector for each charged particle beamlet, wherein the deflector array is configured to at least substantially collimate the array of diverging charged particle beamlets, and
generating electric and/or magnetic fields at least in an area between the charged particle source and the deflector array using a beam manipulation device for aligning the array of charged particle beamlet with respect to the array of deflectors of said deflector array, wherein apparatus comprises a central axis, wherein the charged particle source, a center of the beam splitter and a center of the deflector array are arranged on the central axis, and wherein the beam manipulation device generates:
an electric field substantially perpendicular to the central axis, and/or
a magnetic field substantially perpendicular to the central axis.

23. The method according to claim 22, wherein the apparatus further comprises a control system for the beam manipulation device, wherein the control system adjusts the electric and/or magnetic fields based on a signal from a sensor, wherein the sensor is arranged to determine a deviation of one or more charged particle beamlets of the array of charged particle beamlets from a desired alignment.

24. The method according to claim 23, wherein the sensor is arranged at the deflector array or a collimator lens.

25. The method according to claim 22,
wherein the beam splitter comprises a lens array comprising a plurality of lenses comprising one lens for each charged particle beamlet, wherein each charged particle beamlet of said array of charged particle beamlets is refracted by a lens of the lens array, or
wherein the apparatus comprises a lens array comprising a plurality of lenses comprising one lens for each charged particle beamlet, wherein the lens array is arranged between the beam splitter and the deflector array or collimator lens, wherein each charged particle beamlet of said array of charged particle beamlets is refracted by a lens of the lens array.

26. An apparatus for generating a plurality of charged particle beamlets, comprising:
a charged particle source for generating a diverging charged particle beam,
a beam splitter for splitting said charged particle beam in an array of charged particle beamlets,
a deflector array comprising an array of deflectors comprising one deflector for each charged particle beamlet of said array of charged particle beamlets, wherein the deflector array is configured for at least substantially collimating the array of diverging charged particle beamlets, and
a beam manipulation device configured for generating electric and/or magnetic fields at least in an area between the charged particle source and the deflector array, wherein the electric and/or magnetic fields are configured for optimizing an alignment of the charged particle beamlets on the deflector array,
wherein apparatus comprises a central axis, wherein the charged particle source, a center of the beam splitter and a center of the deflector array are arranged on the central axis, and wherein the beam manipulation device comprises:
a set of at least two coils which are arranged on opposite sides of the central axis and having a common coil center axis, wherein the common coil center axis is arranged in a plane which is substantially perpendicular to the central axis, and/or
a set of at least two electrodes arranged on opposite sides of the central axis and on a common electrode axis, wherein the common electrode axis is arranged in a plane which is substantially perpendicular to the central axis.

* * * * *